United States Patent
Akiyama et al.

(10) Patent No.: US 6,245,647 B1
(45) Date of Patent: Jun. 12, 2001

(54) METHOD FOR FABRICATION OF THIN FILM

(75) Inventors: Shoji Akiyama; Toru Otsuka; Hitoshi Habuka, all of Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/253,763

(22) Filed: Feb. 22, 1999

(30) Foreign Application Priority Data

Feb. 23, 1998 (JP) .................................................. 10-057481

(51) Int. Cl.[7] .................................................. H01L 21/76
(52) U.S. Cl. ............................................ 438/478; 438/680
(58) Field of Search .................................. 438/680, 478; 427/585, 590

(56) References Cited

U.S. PATENT DOCUMENTS

| | | | |
|---|---|---|---|
| 4,786,477 | * 11/1988 | Yoon et al. | 422/145 |
| 5,044,315 | * 9/1991 | Ozias | 427/248.1 |
| 5,234,862 | * 8/1993 | Aketagawa et al. | 438/488 |
| 5,493,987 | * 2/1996 | McDiarmid et al. | 117/102 |
| 5,749,974 | * 5/1998 | Habuka et al. | 118/725 |

FOREIGN PATENT DOCUMENTS

| | | | |
|---|---|---|---|
| 0709488 A1 | * 1/1996 | (EP) . | |
| 8-124865 | 5/1996 | (JP) | H01L/21/205 |

* cited by examiner

*Primary Examiner*—Richard Elms
*Assistant Examiner*—Christian D. Wilson
(74) *Attorney, Agent, or Firm*—Snider & Associates; Ronald R. Snider

(57) ABSTRACT

The invention provides a method for forming a thin film uniform in resistivity distribution on a semiconductor substrate. The temperature of the inside wall (6) of the reaction vessel (2) of vapor phase growth equipment is controlled to below the thermal decomposition temperature of a dopant gas such as diborane, for example, to within a range of room temperature to 250° C. The region of this temperature range is defined so as to range from the upstream-side end of the semiconductor substrate (1) to at least an upstream-side ⅓ point of the substrate diameter along the direction of flow of the dopant gas supplied from one end of the reaction vessel (2), desirably, over the entire region just above the semiconductor substrate (1).

10 Claims, 2 Drawing Sheets

METHOD FOR FABRICATION OF THIN FILM

RELATED APPLICATION

This application claims the priority of Japanese Patent Application No. 10-57481 filed on Feb. 23, 1998, which is incorporated herein by reference.

BACKGROUND OF THE INVENTION

The present invention relates to a method for fabrication of thin films. More specifically, the invention relates to a method for fabricating on a semiconductor substrate a thin film which is uniform in resistivity.

When a thin film such as a silicon semiconductor single crystal thin film having a specified resistivity is fabricated on a semiconductor substrate (hereinafter, referred to simply as "substrate" from time to time) such as a silicon semiconductor single crystal substrate, it is practiced to take the steps of, with the semiconductor substrate placed in a reaction vessel of vapor phase growth equipment, supplying a raw material gas for growth of a thin film as well as a dopant gas through a gas inlet provided in the reaction vessel, and increasing the temperature of the semiconductor substrate higher than the reaction temperature of the raw material gas, by which a thin film doped with dopant elements is deposited and formed on the semiconductor substrate.

As vapor phase growth equipment, conventionally, there have been available those called "hot wall" type in which the inside wall of the reaction vessel is not cooled but left at a temperature nearly equal to the substrate temperature, and those called "cold wall" type in which the inside wall of the reaction vessel is cooled so as to be kept lower than the substrate temperature.

In the hot wall type vapor phase growth equipment, because of the high inside-wall temperature of the reaction vessel, easily thermally-decomposable raw material gas for thin film growth and dopant gas, when introduced into the hot wall type reaction vessel, decompose before reaching the substrate surface, so that a substantial portion of the gases is deposited on the inside-wall surface of the reaction vessel, and thus consumed. Therefore, for the reason that the raw material gas for thin film growth and the dopant gas do not reach the substrate surface sufficiently, there have been issues that film thickness distribution of the thin film to be formed is difficult to control or resistivity distribution within the thin film becomes nonuniform and difficult to control. Whereas the issue of the control of film thickness distribution is beginning to be solved by using a reaction atmosphere under reduced pressure or other means, no effective solutions have been developed for the issue of resistivity distribution.

In the case of the cold wall type vapor phase growth equipment, on the other hand, it is known that because the inside-wall temperature of the reaction vessel is set to about 500° C., which is lower than the thermal decomposition temperature of the raw material gas for thin film growth, deposition of the thin film onto the inside wall of the reaction vessel is suppressed, which produces an effect of preventing losses of the raw material gas for thin film growth. However, attentions have not been paid at all hitherto to losses of the dopant gas due to its thermal decomposition at the inside wall of the reaction vessel. Accordingly, there has been an issue that the resistivity distribution of the thin film may become difficult to control due to any inappropriate setting of the inside-wall temperature of the reaction vessel.

Also, thermal decomposition of the dopant gas at the inside wall of the reaction vessel would cause dopant elements to be deposited on the inside wall of the reaction vessel. Therefore, if the thin film continues to be fabricated without removing the deposit by etching, the deposited dopant elements would be liberated from the inside-wall surface of the reaction vessel during the reaction and mixed into the thin film. This would lead, in some cases, to occurrence of the so-called memory effect that a higher than designed concentration level of dopant is taken into the growing thin film even if a specified level of dopant gas is introduced into the reaction vessel. This memory effect has been a factor that makes it difficult to control the resistivity distribution of thin films among different substrates.

SUMMARY OF THE INVENTION

The present invention having been achieved in view of these and other problems, an object of the invention is to provide a method which makes it possible to form a thin film uniform in resistivity distribution on a semiconductor substrate.

In a first aspect of the present invention, there is provided a thin film fabrication method for forming on a semiconductor substrate a thin film doped with dopant elements comprising steps of placing the semiconductor substrate in a reaction vessel of vapor phase growth equipment, and supplying a raw material gas for thin film growth as well as a dopant gas thereinto, wherein the thin film is formed while the inside wall of the reaction vessel is controlled to below a thermal decomposition temperature of the dopant gas.

Preferably, diborane is used as the dopant gas.

Preferably, the inside-wall temperature of the reaction vessel controlled to below the thermal decomposition temperature of the dopant gas is within a range of room temperature to 250° C., desirably, room temperature to 200° C.

Preferably, the inside wall of the reaction vessel is temperature controlled so that a region thereof opposite to a portion of the semiconductor substrate which ranges, along a direction of flow of the dopant gas supplied from one end of the reaction vessel, from an upstream-side end of the semiconductor substrate to at least an upstream-side ⅓ point of the substrate diameter, desirably, over an entire region just above the semiconductor substrate is controlled to below the thermal decomposition temperature of the dopant gas.

Preferably, the inside wall of the reaction vessel is set to a higher temperature in a pre-heat treatment process or etching process than a temperature during introduction of the dopant gas.

In a second aspect of the invention, there is provided a thin film fabrication method for forming on a semiconductor substrate a thin film comprising steps of placing the semiconductor substrate in a reaction vessel of vapor phase growth equipment and supplying diborane gas thereinto, wherein the thin film is formed while the inside wall of the reaction vessel is controlled to below a thermal decomposition temperature of the diborane gas.

The inventors of the present invention investigated and discussed a method for obtaining a uniform resistivity distribution of the thin film and achieved the present invention.

More specifically, carrying out basic researches to grasp fundamental issues, the inventors have clarified the thermal decomposition temperature of dopant gas and found out for the first time a temperature range that should be set for the inside wall of the reaction vessel.

With respect to diborane gas that is widely used as the p-type dopant gas for the fabrication of silicon semiconductor thin films, the inventors researched the temperature at which boron is deposited by thermal decomposition, and carried out the growth of a semiconductor thin film while controlling the inside-wall temperature of the reaction vessel below an appropriate temperature. As a result, the inventors have found out that diborane gas can be supplied sufficiently onto the substrate surface by suppressing the consumption of diborane gas at the inside wall of the reaction vessel, thus having invented a method for fabricating a silicon semiconductor thin film having a uniform resistivity distribution.

Consequently, in the present invention, by controlling the inside-wall temperature of the reaction vessel below the thermal decomposition temperature of the dopant gas, consumption of the dopant gas at the inside wall of the reaction vessel is suppressed so that the dopant gas can be supplied sufficiently onto the substrate surface.

The region where the inside-wall temperature of the reaction vessel is controlled to below the thermal decomposition temperature of the dopant gas is defined as a region of the inside wall of the reaction vessel which faces a portion of the semiconductor substrate ranging, along a direction of flow of the dopant gas supplied from one end of the reaction vessel, from an upstream-side end of the semiconductor substrate to at least an upstream-side ⅓ point of the inside wall opposite to the main surface of the semiconductor substrate, desirably, over the entire region just above the semiconductor substrate.

This is because the lowest-temperature solid body that is proximate to the semiconductor substrate so as to affect the growth environment is the inside wall of the reaction vessel opposite to the main surface of the semiconductor substrate. If the temperature of this inside wall becomes higher than the thermal decomposition temperature of the dopant gas, the dopant gas would be thermally decomposed by heat of the inside wall of the reaction vessel so as not to be supplied sufficiently onto the substrate surface. This tendency considerably appears with equipment having a narrow distance between the inside wall of the reaction vessel and the semiconductor substrate such as horizontal type vapor phase growth equipment or lately developed single-wafer-processing type vapor phase growth equipment.

However, because the gas is not completely increased in temperature in the upstream of the semiconductor substrate, the dopant gas can be supplied generally uniformly onto the main surface of the semiconductor substrate while being kept from thermal decomposition, by controlling the temperature of the inside wall opposite to the range from the upstream-side end of the semiconductor substrate to at least the upstream-side ⅓ point of the substrate diameter to below the thermal decomposition temperature of the dopant gas.

Also, desirably, the inside-wall temperature of the reaction vessel is higher than the temperature at the time of introduction of the dopant gas in the pre-heat treatment process or etching process. This is because the dopant gas is not introduced in the pre-heat treatment process or etching process so that the inside-wall temperature of the reaction vessel does not need preparatorily lowering. Rather, it is important to raise the inside-wall temperature of the reaction vessel in order that impurities vaporized from the semiconductor substrate and the inside wall of the reaction vessel are prevented from re-aggregating or re-adhering to the inside wall of the reaction vessel.

In addition, by combining the method of the present invention with the method disclosed in Japanese Patent Laid-Open Publication HEI 8-124865, the above-described memory effect can be further suppressed so that the resistivity distribution of the thin film can be further improved.

As described above, according to the present invention, a thin film uniform in resistivity distribution can be formed by carrying out the growth of the thin film while the inside-wall temperature of the reaction vessel of vapor phase growth equipment is controlled to a temperature at which the dopant gas such as diborane does not thermally decompose. Also, a reduction in protrusion defects on the thin film surface, an improvement in the surface flatness, a sharpening of the dopant atom concentration distribution and the like can also be expected. Furthermore, because the deposition of dopant atoms onto the inside wall of the reaction vessel can be suppressed, there is also produced a secondary effect that the frequency of exchanging work for the reaction vessel due to adhesion and accumulation of contaminations on the inside wall of the reaction vessel, which would conventionally be seen, is reduced.

DETAILED DESCRIPTION OF THE PREFERRED EMBODIMENTS

Figure 1:
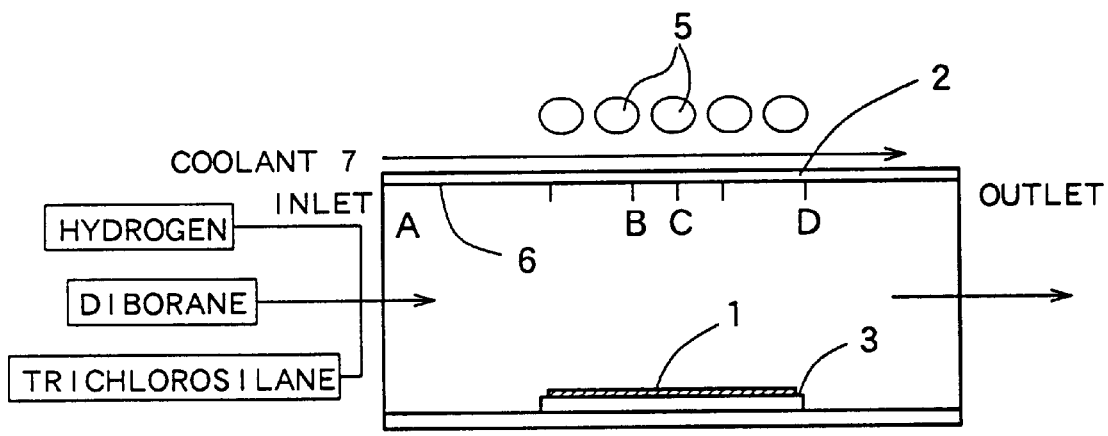
FIG. 1 is a schematic arrangement view showing an example of vapor phase growth equipment to be used in the present invention.

Hereinbelow, an example of embodiments of the present invention is described. FIG. 1 outlines the arrangement of vapor phase growth equipment to be used in embodying the method of the invention. Referring to FIG. 1, a susceptor 3 for placing thereon a substrate 1 is provided in a reaction vessel 2. In order to obtain a successful heating distribution, this susceptor 3 is made of a material having a large heat capacity, for example, graphite coated with silicon carbide. Also, the reaction vessel 2 is made of transparent quartz glass, and outside the reaction vessel 2 is provided an infrared lamp 5 for raising the temperature of the substrate 1, which is placed within the reaction vessel 2, via a transparent wall of the reaction vessel 2. Then, a coolant 7 such as air or water is supplied to between the reaction vessel 2 and the infrared lamp 5 so as to be variable in supply amount or supply temperature. Accordingly, the substrate 1 can be increased in temperature without increasing the temperature of an inside wall 6 of the reaction vessel 2 more than necessary, so that a cold wall type temperature environment is formed. Also, a supply port for hydrogen as a carrier gas, diborane ($B_2H_6$) as a dopant gas, trichlorosilane ($SiHCl_3$) as a raw material gas and the like is connected to one end of the reaction vessel 2, allowing the gases to be supplied selectively at any ratio. Besides, the gases, after passing above the substrate 1, are discharged from the other end of the reaction vessel 2.

With the vapor phase growth equipment of the above arrangement, for forming a silicon thin film containing boron on the main surface of the substrate 1, the substrate 1 is first placed on the susceptor 3, then the substrate 1 is increased in temperature to, for example, 1000° C. by the infrared lamp 5, and a hydrogen gas containing trichlorosilane ($SiHCl_3$) and diborane ($B_2H_6$) is introduced from one end of the reaction vessel 2. As a result, a silicon thin film containing boron is formed on the substrate 1.

In this process, a region of the inside wall 6 of the reaction vessel 2 opposite to a portion of the substrate 1 which ranges, along the direction of flow of the dopant gas beginning with the dopant-gas inlet side (A), from the upstream-side end of the substrate 1 to an upstream-side ⅓ point (B) of the substrate diameter, desirably over the entire region just above the substrate 1 up to a point (D) corresponding to the outlet-side end of the substrate 1, is set to within a temperature range of room temperature to 250° C., desirably room temperature to 200° C. In particular, the above region is desirably provided on the inside wall 6 side of the reaction vessel 2 confronting the surface of the substrate 1.

Next, basic experiments conducted in order to find out an appropriate inside-wall temperature of the reaction vessel 2 are explained. First described are experiment examples performed under the following conditions with a view to finding a temperature at which boron starts being deposited onto the substrate 1 and the inside wall 6 of the reaction vessel 2.

Experiment 1

In Experiment 1, with hydrogen gas and diborane gas, a thin film of boron is deposited on the silicon semiconductor single crystal substrate 1. As shown in FIG. 1, the silicon semiconductor single crystal substrate 1 with the surface unprocessed was placed on the susceptor 3 within the reaction vessel 2 made of transparent quartz glass. Then, the silicon semiconductor single crystal substrate 1 was kept at room temperature as it was, or increased in temperature to 200° C., 250° C., 300° C. and 400° C. by the infrared lamp 5 provided outside the reaction vessel 2, after which a hydrogen gas containing 0.14% diborane gas was introduced for one minute from one end of the reaction vessel 2. As a result of visual observation the surface of the silicon semiconductor single crystal substrate 1 taken out from the reaction vessel 2, no changes were observed in the room-temperature case, whereas the higher the temperature was, the more deeply the surface of the silicon semiconductor single crystal substrate 1 became brown, such that browning was easily observed with the naked eye in the 400° C. case. This means that the amount of deposited boron due to thermal decomposition of the diborane gas increased with increasing temperature, resulting in a thin film formed on the surface of the silicon semiconductor single crystal substrate 1.

Figure 2:
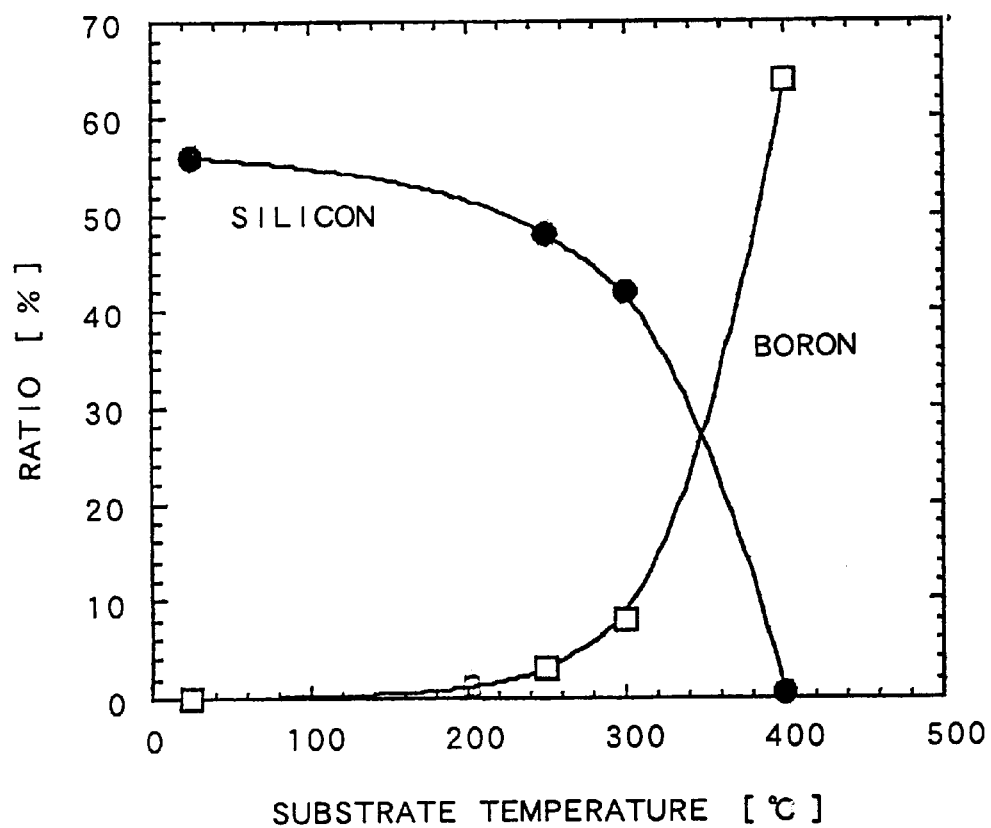
FIG. 2 is a graph showing component ratios of boron and silicon deposited on the substrate surface at a temperature range from room temperature to 400° C.

To ascertain that the thin film is a deposition of boron, the surface of the silicon semiconductor single crystal substrate 1 obtained here was analyzed by XPS (X-ray Photoelectron Spectroscopy). FIG. 2 shows component ratios of boron and silicon elements detected from the surface of the silicon semiconductor single crystal substrate 1 processed at various temperatures. As a result of this, it was found that the deposition of boron due to thermal decomposition of diborane slightly starts at 200° C. Also, with the temperature higher than 250° C., boron was detected at increasingly higher ratios. Further, it has become clear that, with the temperature of 400° C., boron occupies about 65% of the deposit detected from the surface of the silicon semiconductor single crystal substrate 1 and that diborane is noticeably thermally decomposed at around this temperature.

In addition, it should be noted here that a silicon semiconductor single crystal substrate without any treatment on its surface was used. As is well known, the surface of a silicon semiconductor single crystal substrate, in the untreated state, has necessarily been oxidized by oxygen in the air, so that a silicon dioxide thin film (natural oxide film) has been formed. When the silicon semiconductor single crystal substrate is used without any treatment on its surface, diborane is, in strict sense, not thermally decomposed at the silicon surface but yields thermal decomposition reaction at the silicon-dioxide surface having the same components as quartz glass, of which the reaction vessel is made. Accordingly, the result of Experiment 1 could be regarded as showing a phenomenon that occurs at the inside-wall surface of the reaction vessel.

In addition, since diborane gas is decomposed by thermal energy, similar thermal decomposition occurs also at solid surfaces of silicon carbide, carbon, silicon and the like as well as in vapor phases without being limited only to quartz glass. However, in terms of general properties of chemical reactions, it can naturally be predicted that the reaction at the solid surface progresses even at such low temperatures that thermal decomposition in vapor phase does not occur.

From the result as described above, it can be understood that the upper limit of permissible temperature for the inside wall of the reaction vessel is 250° C. It is suggested that when the inside-wall temperature of the reaction vessel becomes higher than this temperature, the amount of deposition of boron onto the inside wall of the reaction vessel due to the thermal decomposition of diborane gas would increase to a significant level, resulting in, for example, consumption of the diborane gas before reaching the substrate surface and thus making it difficult to control the resistivity. Taking into consideration that the deposition of boron due to the thermal decomposition increases more and more with the temperature increasing above 250° C., it follows that the temperature is more desirably below 200° C.

Experiment 2

As shown in FIG. 1, the silicon semiconductor single crystal substrate 1 was placed on the susceptor 3 within the reaction vessel 2. Next, the silicon semiconductor single crystal substrate 1 was increased in temperature to 1000° C. by energizing the infrared lamp 5 provided outside the reaction vessel 2. After an arrival at a certain temperature, a hydrogen gas containing 0.14% diborane ($B_2H_6$) gas was introduced at a rate of 100 liter/min. for one minute from one end of the reaction vessel 2 . In this process, the outside-wall surface of the reaction vessel 2 was cooled by blowing air with a blower, so that the inside-wall temperature of the reaction vessel 2 was controlled to about 200° C.

As a result of this experiment, a thin film composed of boron was deposited on the surface of the silicon semiconductor single crystal substrate 1, where deposition of the boron thin film onto the inside wall 6 of the reaction vessel 2 was not observed at all. In addition, for the measurement of the inside-wall temperature of the reaction vessel 2, a radiation thermometer (not shown) which uses light of about 10 $\mu$m wavelengths for measurement was used.

EXAMPLES

Examples of the present invention are shown below.

Example 1

Vapor phase epitaxial growth of a silicon semiconductor single crystal thin film was conducted under the following conditions. As shown in FIG. 1, a 300 mm-dia., p-type silicon semiconductor single crystal substrate 1 having a (100) main surface was placed on a susceptor 3 within a reaction vessel 2 made of transparent quartz glass. The susceptor 3 with the silicon semiconductor single crystal substrate 1 placed thereon is normally rotated at a rotating speed of about 5 to 50 r.p.m.

Next, the silicon semiconductor single crystal substrate 1 was increased in temperature to 1000° C. in a hydrogen atmosphere by energizing the infrared lamp 5 provided outside the reaction vessel 2. After an arrival at a certain temperature, a hydrogen gas containing 15 g/min. trichlorosilane ($SiHCl_3$) gas as a raw material gas for thin film growth and 0.003 ppm diborane ($B_2H_6$) gas as a dopant was introduced at 100 liter/min. for one minute from the inlet of the reaction vessel 2. In this process, the outside-wall surface of the reaction vessel 2 was cooled by blowing air with a blower in order that the inside-wall temperature of the reaction vessel 2 was controlled to below 250° C. As a result, an about 1.5 µm thick silicon single crystal thin film (epitaxial film) containing boron as an additive was formed on the silicon semiconductor single crystal substrate 1.

As a result of measuring the resistivity of this silicon single crystal thin film, an average resistivity of about 1 Ω·cm was obtained. As a result of evaluating the in-plane nonuniformity of resistivity distribution of the thin film by the following equation, the resistivity variation was 1.5%:

Resistivity variation=100×(resistance max. value−resistance min. value)/(resistance max. value+resistance max. value)

In this connection, with a lookup to temperature-measurement results of the inside wall 6 of the reaction vessel 2 by the radiation thermometer, it was shown that the temperature was 220° C. at the point (C) opposite to the center of the substrate, 200° C. at the point (B) opposite to the upstream-side ⅓ point of the substrate, and 250° C. at the point (D) opposite to the downstream-side end of the substrate.

Comparative Example 1

As a result of forming a silicon single crystal thin film under the same conditions as in Example 1 except that the inside-wall temperature of the reaction vessel 2 was 500° C., the resistivity variation was 3%.

Example 2

Figure 3:
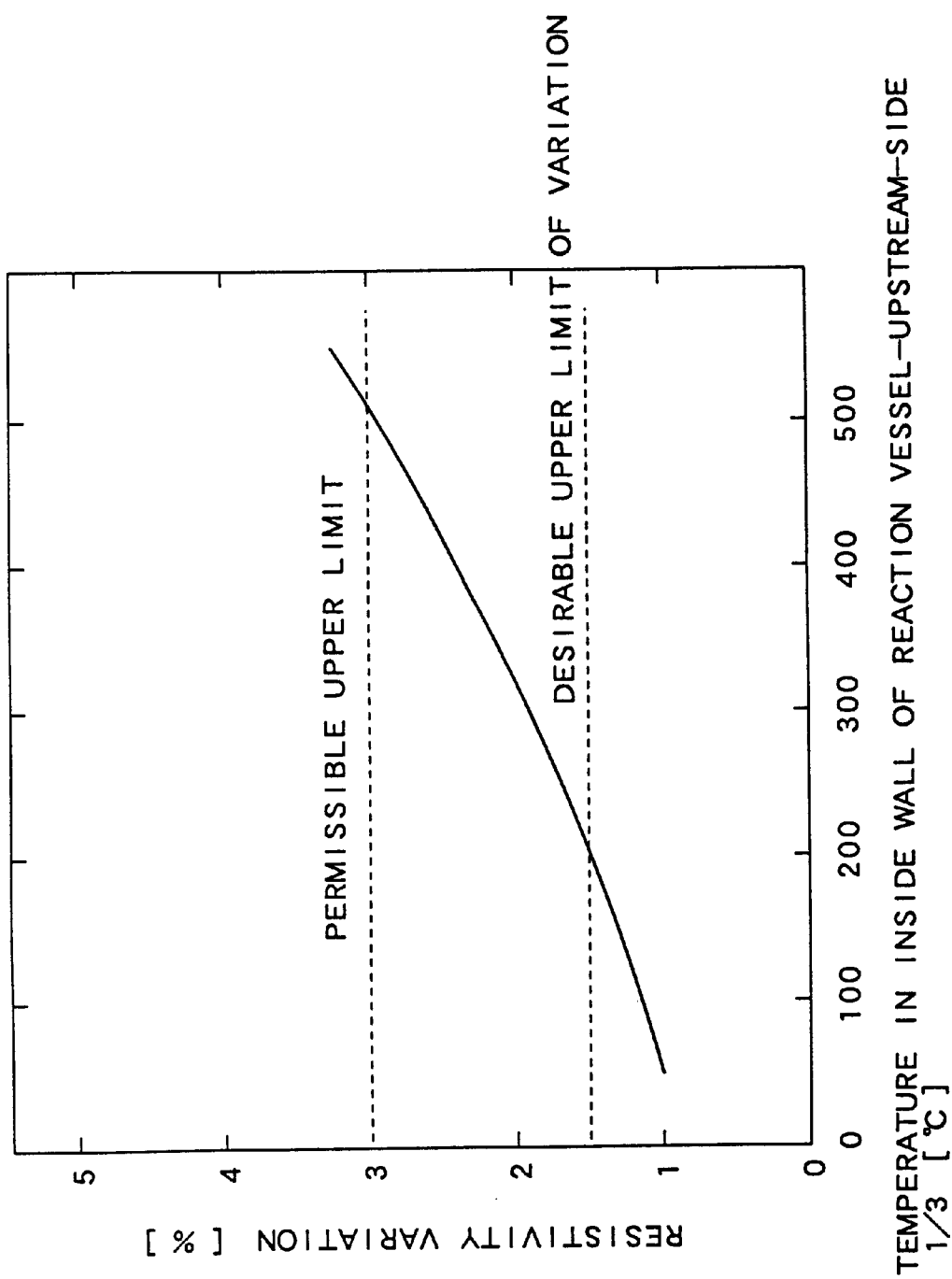
FIG. 3 is a graph showing the relationship between inside-wall temperature of the reaction vessel and resistivity, at a point opposite to the upstream-side ⅓ point of the substrate under various inside-wall temperature conditions of the reaction vessel.

Next, with a variety of settings of the inside-wall temperature of the reaction vessel 2 from room temperature to 500° C., a silicon single crystal thin film was formed in the same way as in Example 1. Then, the relationship between the inside-wall temperature of the reaction vessel 2 at the point (B) opposite to the upstream-side ⅓ point of the substrate and the resistivity variation was shown in FIG. 3 together with a permissible limit. It was found from FIG. 3 that when the inside-wall temperature of the reaction vessel 2 at the point (B) opposite to the upstream-side ⅓ point of the substrate is over 200° C., the resistivity variation becomes larger than the desirable upper limit (1.5%) of resistivity variation, and that with the inside-wall temperature over 500° C., the variation exceeds the permissible upper limit (3.0%).

Furthermore, it was clarified through Examples 1 and 2 that improvements in the following qualities are attained in addition to the control of resistivity distribution.

Firstly, minute particulate protrusions of around 1 µm size as well as large protrusions of more than several tens µm size adhering to the surface of the semiconductor silicon single crystal thin film were reduced. This could be attributed to the reason that with diborane, for example, used as the dopant gas, thermal decomposition of the diborane was suppressed by appropriately controlling the inside-wall temperature of the reaction vessel so that the formation of boron particles at the inside wall of the reaction vessel was prevented, by which the phenomenon that those boron particles are separated from the inside wall of the reaction vessel so as to float and adhere to the main surface of the semiconductor silicon single crystal substrate or the surface of the semiconductor silicon single crystal thin film was prevented. The aspect that even large protrusions were also reduced could be regarded as meaning that an occurrence in the prior art that while boron particles are separating from the inside wall of the reaction vessel and floating, diborane or the silicon raw material gas such as trichlorosilane is thermally decomposed at the surfaces of the particles, causing the particles to be large-scaled, has been prevented by the present invention.

Secondly, an improvement of surface flatness is achieved. As is well known, use of diborane gas or the like accelerates the growth rate of a silicon semiconductor single crystal thin film to a few % higher than that in nonuse. When aggregates of boron atoms (on the order of several atoms or more) are deposited and dispersed on the surface of the growing silicon semiconductor single crystal thin film due to the thermal decomposition of diborane gas, it would occur conventionally that the growth rate around the deposition increases so as to affect the film thickness distribution in small ranges, resulting in a broadened thickness distribution in 20 to 30 mm square ranges. However, by the present invention, the flatness of the thickness distribution in small ranges has also been improved. This is attributed to the reason that thermal decomposition of diborane at the inside wall of the reaction vessel and resultant formation of boron particles and aggregates have been suppressed.

Thirdly, since abnormal adhesion of boron atoms and adhesion of aggregates onto the semiconductor silicon single crystal substrate have been prevented as shown above, the variation gradient of boron atom concentration distribution at the interface between the silicon semiconductor single crystal thin film and the silicon semiconductor single crystal substrate has become even sharper than it has been conventionally.

The above description has been made by focusing on a case in which boron atoms are added to the thin film with diborane gas used as a dopant gas in the fabrication of a silicon semiconductor single crystal thin film with trichlorosilane gas used as a raw material gas for thin film growth. However, the present invention is not limited to this. The invention is effective also when arsine ($AsH_3$), phosphine ($PH_3$) or the like other than diborane is used as the dopant gas.

What is claimed is:

1. A thin film fabrication method by a cold wall type vapor phase growth equipment for forming on a semiconductor substrate a thin film doped with dopant elements comprising steps of placing the semiconductor substrate in a reaction vessel of the cold wall type vapor phase growth equipment, increasing a temperature of the semiconductor substrate higher than a reaction temperature of a raw material gas, and supplying the raw material gas for thin film growth as well as a dopant gas thereinto, wherein the thin film is formed while the inside wall of the reaction vessel is controlled to below a thermal decomposition temperature of the dopant gas.

2. The thin film fabrication method according to claim 1, wherein diborane is used as the dopant gas.

3. The thin film fabrication method according to claim 1, wherein the inside-wall temperature of the reaction vessel controlled to below the thermal decomposition temperature of the dopant gas is within a range of room temperature to 250° C.

4. The thin film fabrication method according to claim 1, wherein the inside wall of the reaction vessel is temperature controlled so that a region thereof opposite to a portion of the semiconductor substrate which ranges, along a direction of flow of the dopant gas supplied from one end of the reaction vessel, from an upstream-side end of the semiconductor substrate to at least an upstream-side 1/3 point of the substrate diameter is controlled.

5. The thin film fabrication method according to claim 1, wherein the inside wall of the reaction vessel is set to a higher temperature in a pre-heat treatment process or etching process than a temperature during introduction of the dopant gas.

6. The thin film fabrication method according to claim 4, wherein the inside wall of the reaction vessel is set to a higher temperature in a pre-heat treatment process or etching process than a temperature during introduction of the dopant gas.

7. A thin film fabrication method by a cold wall type vapor phase growth equipment for forming on a semiconductor substrate a thin film comprising steps of placing the semiconductor substrate in a reaction vessel of the cold wall type vapor phase growth equipment, increasing a temperature of the semiconductor substrate higher than a reaction temperature of a raw material gas, and supplying diborane gas thereinto, wherein the thin film is formed while the inside wall of the reaction vessel is controlled to below a thermal decomposition temperature of the diborane gas.

8. The thin film fabrication method according to claim 1, wherein the inside-wall temperature of the reaction vessel controlled to below the thermal decomposition temperature of the dopant gas is within a range of room temperature to 200° C.

9. The thin film fabrication method according to claim 1, wherein the inside wall of the reaction vessel is temperature controlled so that a region thereof opposite to a portion of the semiconductor substrate which ranges, along a direction of flow of the dopant gas supplied from one end of the reaction vessel, from an upstream-side end of the semiconductor substrate to over an entire region just above the semiconductor substrate is controlled.

10. The thin film fabrication method according to claim 9, wherein the inside wall of the reaction vessel is set to a higher temperature in a pre-heat treatment process or etching process than a temperature during introduction of the dopant gas.

* * * * *